United States Patent
Nakamura et al.

(10) Patent No.: US 11,455,248 B2
(45) Date of Patent: Sep. 27, 2022

(54) SEMICONDUCTOR DEVICE CAPABLE OF PERFORMING SOFTWARE LOCK-STEP

(71) Applicant: RENESAS ELECTRONICS CORPORATION, Tokyo (JP)

(72) Inventors: Atsushi Nakamura, Tokyo (JP); Akihiro Yamamoto, Tokyo (JP); Kazuaki Terashima, Tokyo (JP); Manabu Koike, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 244 days.

(21) Appl. No.: 16/868,041

(22) Filed: May 6, 2020

(65) Prior Publication Data

US 2021/0349819 A1 Nov. 11, 2021

(51) Int. Cl.
*G06F 12/06* (2006.01)
*G06F 9/30* (2018.01)
(Continued)

(52) U.S. Cl.
CPC ...... *G06F 12/0615* (2013.01); *G06F 9/30101* (2013.01); *G06F 9/30189* (2013.01); *G06F 9/4812* (2013.01); *G06F 9/524* (2013.01); *G06F 12/0284* (2013.01); *G06F 13/1684* (2013.01); *G11C 11/4082* (2013.01)

(58) Field of Classification Search
CPC ............. G06F 12/0615; G06F 9/30101; G06F 9/30189; G06F 9/4812; G06F 9/524; G06F 12/0284; G06F 13/1684; G06F 2212/1024; G06F 2212/1032; G06F 2212/1052; G06F 12/0292; G06F 12/0638; G06F 12/1441; G06F 11/1641; G11C 11/4082
See application file for complete search history.

(56) References Cited

U.S. PATENT DOCUMENTS 8,443,230 B1 * 5/2013 James-Roxby ..... G06F 11/1683
714/11
8,479,042 B1 7/2013 James-Roxby et al.
(Continued)

FOREIGN PATENT DOCUMENTS

EP 3 588 309 A2 1/2020
JP 2020-004108 A 1/2020

OTHER PUBLICATIONS

Extended European Search Report issued in corresponding European Patent Application No. 21172418.2-1203, dated Oct. 1, 2021.

*Primary Examiner* — Sean D Rossiter
(74) *Attorney, Agent, or Firm* — McDermott Will & Emery LLP

(57) ABSTRACT

A semiconductor device performs a software lock-step. The semiconductor device includes a first circuit group including a first Intellectual Property (IP) to be operated in a first address space, a first bus, and a first memory, a second circuit group including a second IP to be operated in a second address space, a second bus, and a second memory, a third bus connectable to a third memory, and a transfer control circuit coupled to the first to third buses. when the software lock-step is performed, the second circuit group converts an access address from the second IP to the second memory such that an address assigned to the second memory in the second address space is a same as an address assigned to the first memory in the first address space.

9 Claims, 5 Drawing Sheets

(51) Int. Cl.
*G06F 9/48* (2006.01)
*G06F 9/52* (2006.01)
*G06F 12/02* (2006.01)
*G06F 13/16* (2006.01)
*G11C 11/408* (2006.01)

(56) References Cited

U.S. PATENT DOCUMENTS

| | | | |
|---|---|---|---|
| 2013/0088911 A1* | 4/2013 | Nakura | G11C 13/0002 |
| | | | 365/148 |
| 2018/0089059 A1* | 3/2018 | Lee | G06F 11/1641 |
| 2020/0073806 A1* | 3/2020 | Hayakawa | G06F 11/1641 |

* cited by examiner

SEMICONDUCTOR DEVICE CAPABLE OF PERFORMING SOFTWARE LOCK-STEP

BACKGROUND

The present disclosure relates to a semiconductor device.

A semiconductor device, which is installed in autonomous driving vehicles, is required to be highly reliable. On the other hand, a semiconductor device may perform unintentional operations due to cosmic rays or physical deterioration. This means that a failure may occur in the semiconductor device. Since it is not possible to prevent all failures that occur in the semiconductor device, it is required to detect that a failure has occurred.

One technique for detecting a failure that occurs in a semiconductor device is a technique called lock-step. In this technique, two circuit blocks which can realize the same function are used, and each circuit block is operated at a specific timing. After the processing of the two circuit blocks is completed, the processing results of the two circuit blocks are compared.

There are disclosed techniques listed below.
[Patent Document 1] Japanese Unexamined Patent Application Publication No. 2020-4108

Patent Document 1 discloses a semiconductor device for performing a SoftWare Lock-Step (SWLS). The semiconductor device disclosed in Patent Document 1 includes a CPU 10, a CPU 20, a CPU 230, and a memory 260. During the SWLS operation, each of the CPU 10 and the CPU 20 reads program and data for the SWLS stored in the memory 260. Each of the CPU 10 and the CPU 20 executes the program for the SWLS to write the execution results in the memory 260. The CPU 230 reads the execution result of the CPU 10 and the execution result of the CPU 20 from the memory 260, and compares them.

SUMMARY

The semiconductor device for performing the SWLS disclosed in Patent Document 1 can cause the CPU 10 and the CPU 20 to perform different processing, respectively. Therefore, when the SWLS operation and the non-SWLS operation are mixed, the semiconductor device performing the SWLS has an advantage that the hardware resources (CPU 10 and CPU 20) can be effectively utilized.

However, during the SWLS operation, each of the CPU 10 and the CPU 20 reads the program and the data for the SWLS from the memory 260, and writes the execution result in the memory 260. Further, the CPU 230 reads the execution result of the CPU 10 and the execution result of the CPU 20 from the memory 260. That is, there is a problem that the bus bandwidth required for accessing the memory 260 increases during the SWLS operation.

Other objects and new features will be apparent from the description of this specification and the accompanying drawings.

A semiconductor device according to one embodiment performs a SoftWare Lock-Step (SWLS). The semiconductor device includes a first circuit group including a first Intellectual Property (IP) to be operated in a first address space, a first bus, and a first memory coupled to the first IP via the first bus, a second circuit group including a second IP to be operated in a second address space, a second bus, and a second memory coupled to the second IP via the second bus, a third bus connectable to a third memory, and a transfer control circuit coupled to the first to third buses, and including a comparator. When the SWLS is performed, the transfer control circuit transfers a program for the SWLS from the third memory to the first and second memories. The first IP executes the program for the SWLS stored in the first memory to store a first execution result in the first memory. The second IP executes the program for the SWLS stored in the second memory to store a second execution result in the second memory. The transfer control circuit reads the first and second execution results from the first and second memories, and compares the first execution result with the second execution result using the comparator. The second circuit group converts an access address from the second IP to the second memory such that an address assigned to the second memory in the second address space is a same as an address assigned to the first memory in the first address space.

According to one embodiment, it is possible to reduce the bus bandwidth required for accessing the memory during the SWLS operation.

DETAILED DESCRIPTION

Figure 1:
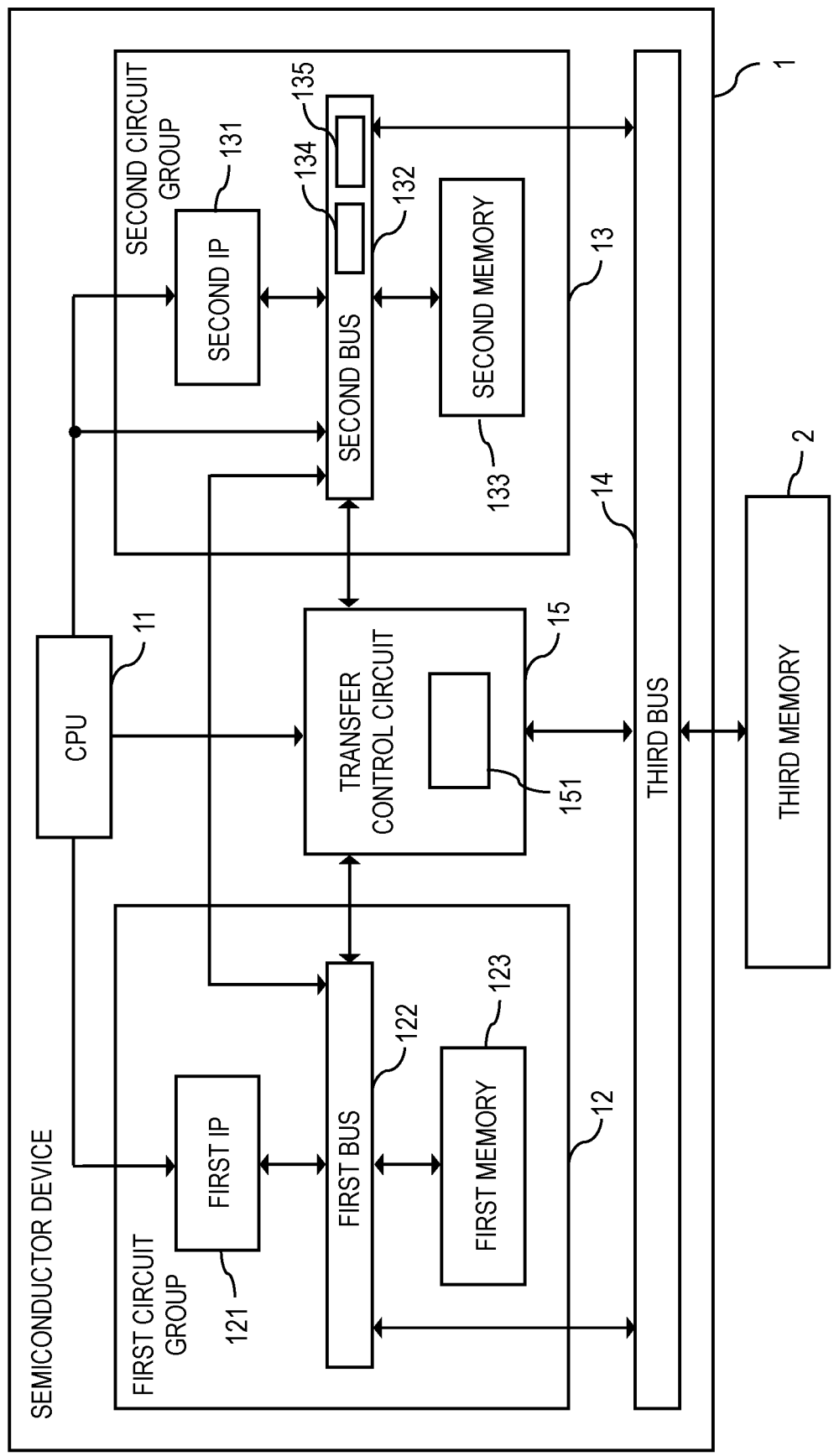
FIG. 1 is a block diagram showing an example of a configuration of a semiconductor device according to a first embodiment.

Hereinafter, embodiments will be described in detail with reference to the drawings. In the specification and the drawings, the same or corresponding components are denoted by the same reference numerals, and a repetitive description thereof is omitted. In the drawings, for convenience of description, the configuration may be omitted or simplified.

First Embodiment

FIG. 1 is a block diagram showing an example of a configuration of a semiconductor device 1 according to a first embodiment. As shown in FIG. 1, the semiconductor device 1 includes a Central Processing Unit (CPU) 11, a first circuit group 12, a second circuit group 13, a third bus 14, and a transfer control circuit 15. The first circuit group 12 includes a first Intellectual Property (IP) 121, a first bus 122, and a first memory 123. The second circuit group 13 includes a second IP 131, a second bus 132, and a second memory 133.

In the first embodiment, the first circuit group 12 and the second circuit group 13 perform a SoftWare Lock-Step (SWLS). In the SWLS, the same program for the SWLS is executed by the first IP 121 and the second IP 131, and the execution result of the first IP 121 and the execution result of the second IP 131 are compared. That is, the SWLS refers to processing of detecting a failure that has occurred in a semiconductor device by executing, by a plurality of IPs, the programs having the same result and confirming that the execution results of the plurality of IPs are the same.

In addition, in the first embodiment, the operation when the first circuit group 12 and the second circuit group 13 are performing a series of processing related to the SWLS is expressed as a SWLS operation. On the other hand, the operation when the first circuit group 12 and the second circuit group 13 are not performing a series of processing related to the SWLS is expressed as a non-SWLS operation.

The first memory 123 and the second memory 133 are memories such as, for example, a Static Random Access Memory (SRAM). In the first embodiment, the first memory 123 and the second memory 133 are described as the configurations provided independently of the first IP 121 and the second IP 131, respectively, but the present disclosure is not limited thereto. That is, the first memory 123 and the second memory 133 may be built in the first IP 121 and the second IP 131, respectively.

Further, the semiconductor device 1 is connected to a third memory 2. Specifically, the third memory 2 is connected to the third bus 14 in the semiconductor device 1. The third memory 2 is a memory such as, for example, a Double Data Rate-Synchronous Dynamic Random Access Memory (DDR-SDRAM). In the first embodiment, the third memory 2 is described as being outside the semiconductor device 1, but this present disclosure is not limited thereto. That is, the third memory 2 may be inside the semiconductor device 1.

The CPU 11 is connected to the first IP 121, the second IP 131, the second bus 132 and the transfer control circuit 15. The CPU 11 controls the operation of the first IP 121, the second IP 131, and the transfer control circuit 15 during the SWLS operation.

The CPU 11 performs a setting for causing the transfer control circuit 15 to transfer the program and data for the SWLS from the third memory 2 to the first memory 123 and the second memory 133. The setting is performed, for example, by storing the address of the third memory 2 in a register for storing the transfer source address in the transfer control circuit 15, and storing the addresses of the first memory 123 and the second memory 133 in a register for storing the transfer destination address in the transfer control circuit 15. Thereafter, the CPU transmits an activation request for causing the transfer control circuit 15 to start the transfer of the program and data for the SWLS to the transfer control circuit 15.

Further, after the CPU 11 detects that transferring the program and data for the SWLS by the transfer control circuit 15 has been completed, the CPU 11 transmits, to each of the first IP 121 and the second IP 131, an activation request for causing each of the first IP 121 and the second IP 131 to execute the program for the SWLS. The execution result of the program for the SWLS by the first IP 121 is stored in the first memory 123 as a first execution result. The execution result of the program for the SWLS by the second IP 131 is stored in the second memory 133 as a second execution result.

Furthermore, after the CPU 11 detects that executing the program for the SWLS by the first IP 121 and second IP 131 has been completed, the CPU 11 transmits, to the transfer control circuit 15, an activation request for causing the transfer control circuit 15 to read the first execution result stored in the first memory 123 and the second execution result stored in the second memory 133 and to compare them.

In addition, the CPU 11 sets a first value indicating that the SWLS is to be performed or a second value indicating that the SWLS is not to be performed in an operation mode setting register 134 included in the second bus 132. The details of the operation mode setting register 134 will be described later.

The first IP 121 is connected to the CPU 11 and the first bus 122. The first bus 122 is connected to the first memory 123. The first IP 121 operates in a first address space. In the first address space, a predetermined address is assigned to the first memory 123. The first IP 121 accesses the first memory 123 using the address assigned to the first memory 123 in the first address space.

Further, the first IP 121 reads and executes the program for the SWLS stored in the first memory 123 based on the control of the CPU 11. At this time, the first IP 121 reads the data for the SWLS stored in the first memory 123 and writes data generated by executing the program for the SWLS in the first memory 123, in accordance with addresses written in the program for the SWLS. The data generated by executing the program for the SWLS includes the execution result of the program for the SWLS by the first IP 121, that is, the first execution result.

The second IP 131 is connected to the CPU 11 and the second bus 132. Further, the second bus 132 is connected to the second memory 133. The second IP 131 operates in the second address space. In the second address space, a predetermined address is assigned to the second memory 133. The second IP 131 accesses the second memory 133 using the address assigned to the second memory 133 in the second address space.

Further, the second IP 131 reads and executes the program for the SWLS stored in the second memory 133 based on the control of the CPU 11. At this time, the second IP 131 reads the data for the SWLS stored in the second memory 133 and writes data generated by executing the program for the SWLS in the second memory 123, in accordance with addresses written in the program for the SWLS. The data generated by executing the program for the SWLS includes the execution result of the program for the SWLS by the second IP 131, that is, the second execution result.

The second bus 132 also includes the operation mode setting register 134 and an address conversion circuit 135. Either the first value indicating that the SWLS is to be performed or the second value indicating that the SWLS is not to be performed is set in the operation mode setting register 134. As described above, the first and second values are set by the CPU 11.

The address conversion circuit 135 determines whether to convert an access address from the second IP 131 to the second memory 133 based on the values set in the operation mode setting register 134. More specifically, when the first value is set in the operation mode setting register 134, the address conversion circuit 135 converts the access address from the second IP 131 to the second memory 133 such that the address assigned to the second memory 133 in the second address space is the same as the address assigned to the first memory 123 in the first address space. On the other hand, when the second value is set in the operation mode setting register 134, the address conversion circuit 135 does not convert the access address from the second IP 131 to the second memory 133.

The program for the SWLS is written to be executed by the first IP 121. That is, the address for data access written in the program for the SWLS corresponds to the address assigned to the first memory 123 in the first address space. During the SWLS operation, the first IP 121 is required to access the first memory 123 and the second IP 131 is required to access the second memory 133, in accordance with the address written in the program for the SWLS.

However, in the SWLS operation, since the first IP 121 and the second IP 131 execute the same program for the SWLS written for the first IP 121, the second IP 131 cannot access the second memory 133 in accordance with the address written in the program for the SWLS.

In the first embodiment, when the first circuit group 12 and the second circuit group 13 perform the SWLS, the CPU 11 sets the first value indicating that the SWLS is to be performed in the operation mode setting register 134. When the first value is set in the operation mode setting register 134, the address conversion circuit 135 converts the access address from the second IP 131 to the second memory 133 such that the address assigned to the second memory 133 in the second address space is the same as the address assigned to the first memory 123 in the first address space. As a result, the second IP 131 can access to the second memory 133 even appropriately if the second IP 131 executes the program for the SWLS written for the first IP 121.

As described above, in the SWLS operation, the second circuit group 13 converts the access address from the second IP 131 to the second memory 133 such that the address assigned to the second memory 133 in the second address space is the same as the address assigned to the first memory 123 in the first address space. Therefore, even if the same program for the SWLS is executed, the first circuit group 12 and the second circuit group 13 can perform the SWLS appropriately.

On the other hand, in the non-SWLS operation, the second circuit group 13 does not convert the access address from the second IP 131 to the second memory 133. Therefore, the second IP 131 in the non-SWLS operation can access the second memory 133 appropriately. That is, even when the SWLS operation and the non-SWLS operation are mixed, the semiconductor device 1 operates properly.

As shown in FIG. 1, the semiconductor device 1 includes a path connecting the first bus 122 and the second bus 132 without passing through the transfer control circuit 15. Therefore, in the non-SWLS operation, the first IP 121 can access the second memory 133 in addition to the first memory 123, and the second IP 131 can access the first memory 123 in addition to the second memory 133 using this path. In addition, the semiconductor device 1 includes a path connecting the first bus 122 and the third bus 14 without passing through the transfer control circuit 15, and a path connecting the second bus 132 and the third bus 14 without passing through the transfer control circuit 15. Therefore, in the non-SWLS operation, each of the first IP 121 and the second IP 131 can access the third memory 2 using these paths.

The transfer control circuit 15 is connected to the CPU 11, the first bus 122, the second bus 132, and the third bus 14. In the SWLS operation, the transfer control circuit 15 transfers the program and data for the SWLS, reads the first execution result and the second execution result, and compares them.

The transfer control circuit 15 transfers the program and data for the SWLS based on the control of the CPU 11. The transfer control circuit 15 reads the program and data for the SWLS stored in the third memory 2 via the third bus 14. The transfer control circuit 15 transfers the read program and data for the SWLS to the first memory 123 and the second memory 133 via the first bus 122 and the second bus 132. In that case, considering that the access address from the second IP 131 to the second memory 123 is converted during the SWLS operation, the transfer control circuit 15 transfers the program and data for the SWLS such that the arrangement to the first memory 123 and the arrangement to the second memory are the same.

Further, the transfer control circuit 15 reads the first execution result stored in the first memory 123 and the second execution result stored in the second memory 133 based on the control of the CPU 11. At this time, the first execution result and the second execution result are read via the first bus 122 and the second bus 132. The transfer control circuit 15 includes a comparator 151, and compares the first execution result and the second execution result using the comparator 151.

Thereafter, the transfer control circuit 15 stores the first execution result in the third memory 2 via the third bus 14. Further, when the first execution result and the second execution result do not coincide with each other, the transfer control circuit 15 transmits an interrupt signal for notifying that the first execution result and the second execution result do not coincide with each other to the CPU 11.

Figure 2:
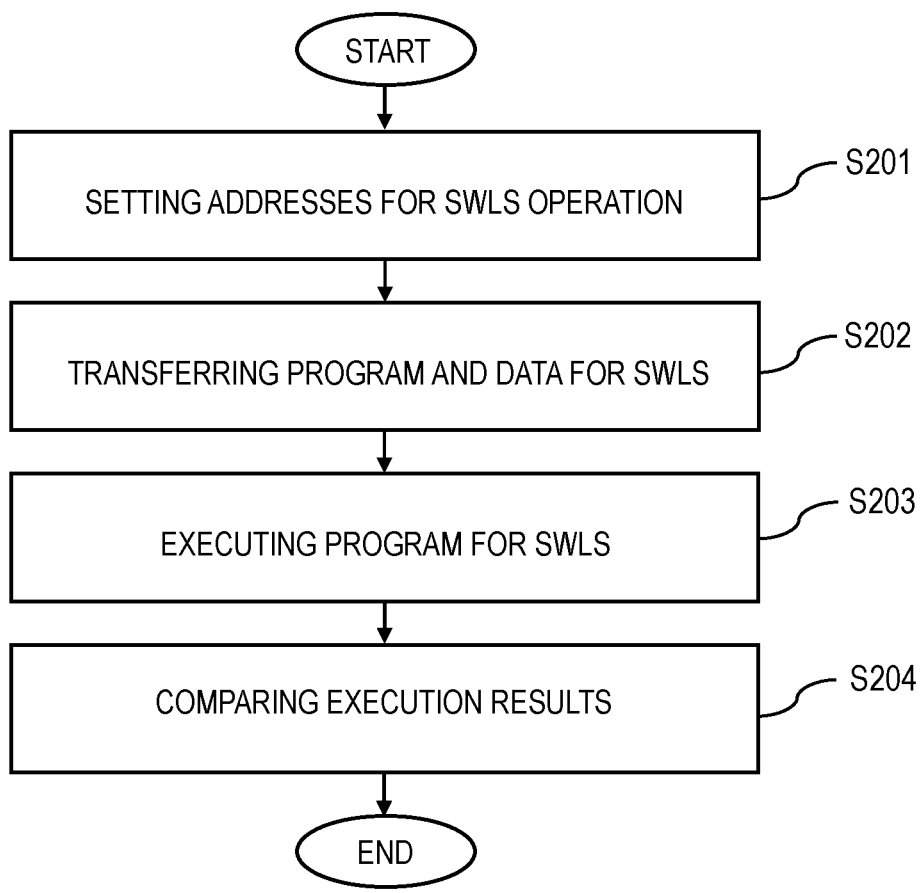
FIG. 2 is a flowchart showing an example of a SoftWare Lock-Step (SWLS) operation of the semiconductor device according to the first embodiment.

Next, the SWLS operation of the semiconductor device 1 according to the first embodiment will be described. FIG. 2 is a flowchart showing an example of the SWLS operation of the semiconductor device 1 according to the first embodiment. The flowchart of FIG. 2 includes four processing steps S201-S204. At first, in the step S201, processing of setting addresses for the SWLS operation is performed. In the processing of setting the addresses, the CPU 11 sets the first value indicating that SWLS is to be performed in the operation mode setting register 134. By setting the first value, the conversion of the access address from the second IP 131 to the second memory 133 is performed.

Next, in the step S202, processing of transferring the program and data for the SWLS is performed. In the processing of transferring the program and data for the SWLS, the CPU 11 performs the setting for causing the transfer control circuit 15 to transfer the program and data for the SWLS from the third memory 2 to the first memory 123 and the second memory 133, and activates the transfer control circuit 15 to cause the transfer control circuit 15 to start the transfer. The activated transfer control circuit 15 reads the program and data for the SWLS stored in the third memory 2 via the third bus 14. The transfer control circuit 15 transfers the read program and data for the SWLS to the first memory 123 and the second memory 133 via the first bus 122 and the second bus 132.

At this time, the transfer control circuit 15 transfers the program and data for the SWLS to the first memory 123 and the second memory 133 in one read processing. That is, the bus bandwidth required for accessing the third memory 3 can be reduced compared to the case where the transfer from the third memory 2 to the first memory 123 and the transfer from the third memory 2 to the second memory 133 are performed separately. In addition, in the first embodiment, since the conversion of the access address by the address conversion circuit 135 is performed, the first IP 121 and the second IP 131 can execute the same program for the SWLS. As a result, the transfer of the program for the SWLS can be performed in one transfer processing.

Next, in the step S203, processing of executing the program for the SWLS is performed. In the processing of executing the program for the SWLS, the CPU 11 detects that transferring the program and data for the SWLS by the transfer control circuit 15 has been completed. For example, the transfer control circuit 15 transmits a signal for notifying the transfer completion to the CPU 11 and the CPU 11 receives the signal, whereby the CPU 11 can detect that the transfer processing by the transfer control circuit 15 has been completed. After the CPU 11 detects that transferring the program and data for the SWLS by the transfer control circuit 15 has been completed, the CPU 11 activates the first IP 121 and the second IP 131 to cause the first IP 121 and the second IP 131 to execute the program for the SWLS.

The activated first IP 121 reads and executes the program for the SWLS stored in the first memory 123. At this time, the first IP 121 accesses the first memory 123 using the address assigned to the first memory 123 in the first address space. The first IP 121 stores the execution result of the program for the SWLS in the first memory 123 as the first execution result.

Further, the activated second IP 131 reads and executes the program for the SWLS stored in the second memory 133. At this time, the second IP 131 accesses the second memory 133 using the address assigned to the second memory 133 in the second address space. The second IP 131 stores the execution result of the program for the SWLS in the second memory 133 as the second execution result.

The first address space in which the first IP 121 operates differs from the second address space in which the second IP 131 operates. That is, the address assigned to the first memory 123 in the first address space is different from the address assigned to the second memory 133 in the second address space. In the SWLS operation, the first IP 121 and the second IP 131 execute the same program for the SWLS. Therefore, in the SWLS operation, the second circuit group 13 converts the access address from the second IP 131 to the second memory 133 such that the address assigned to the second memory 133 in the second address space is the same as the address assigned to the first memory 123 in the first address space.

Specifically, the address conversion circuit 135 confirms the value set in the operation mode setting register 134. In the SWLS operation, since the first value indicating that the SWLS is to be performed is set in the step S201, the address conversion circuit 135 converts the access address from the second IP 131 to the second memory 133 such that the address assigned to the second memory 133 in the second address space is the same as the address assigned to the first memory 123 in the first address space. As a result, the second IP 131 can realize the operation of the SWLS appropriately even if the second IP 131 executes the program for the SWLS written for the first IP 121.

Finally, in the step S204, processing of comparing the execution results is performed. In the processing of comparing the execution results, the CPU 11 detects that executing the program for the SWLS by the first IP 121 and the second IP 131 has been completed. For example, each of the first IP 121 and the second IP 131 transmits a signal for notifying the completion of the execution processing of the program for the SWLS to the CPU 11 and the CPU 11 receives the signal from the first IP 121 and the signal from the second IP 131, whereby the CPU 11 can detect that the execution processing of the program for the SWLS by the first IP 121 and the second IP 131 has been completed. After the CPU 11 detects that executing the program for the SWLS by the first IP 121 and the second IP 131 has completed, the CPU activates the transfer control circuit 15 to cause the transfer control circuit 15 to read the first execution result stored in the first memory 123 and the second execution result stored in the second memory 133 and to compare them.

The activated transfer control circuit 15 reads the first execution result from the first memory 123 via the first bus 122. Further, the transfer control circuit 15 reads the second execution result from the second memory 133 via the second bus 132. The transfer control circuit 15 compares the first execution result with the second execution result using the comparator 151. The transfer control circuit 15 stores the first execution result in the third memory 2 via the third bus 14. The transfer control circuit 15 stores only one execution result in the third memory 2 while comparing the two execution results, and therefore does not increase the bus bandwidth required for accessing the third memory 2. In addition, when the first execution result and the second execution result do not coincide with each other, the transfer control circuit 15 transmits the interrupt signal for notifying that the first execution result and the second execution result do not coincide with each other to the CPU 11.

When the processing of the step S204 is completed, the series of operations of the SWLS is completed. Thereafter, when the semiconductor device 1 shifts from the SWLS operation to the non-SWLS operation, the CPU 11 sets the second value indicating that the SWLS is not to be performed in the operation mode setting register 134.

As described above, according to the first embodiment, since the transfer control circuit 15 can transfer the program and data for the SWLS by one read processing from the third memory 2, in other words, one transfer processing from the third memory 2 to the first memory 123 and the second memory 133, the bus bandwidth required for accessing the third memory 2 can be reduced.

Further, in the first embodiment, when the SWLS is performed, the second circuit group 13 converts the access address from the second IP 131 to the second memory 133 such that the address assigned to the second memory 133 in the second address space is the same as the address assigned to the first memory 123 in the first address space. As a result, the second IP 131 can access to the second memory 133 appropriately even if the second IP 131 executes the program for the SWLS written for the first IP 121.

In FIG. 1, the first circuit group 12 and the second circuit group 13 are shown as having the same configuration provided with the IP, the bus, and the memory, but the first circuit group 12 and the second circuit group 13 are not necessarily required to have the same configuration. That is, the first circuit group and the second circuit group 13 may have asymmetric configurations as long as they can perform the SWLS.

In FIG. 1, each of the first circuit group 12 and the second circuit group 13 is shown as having the configuration provided with one IP, but each of the first circuit group 12 and the second circuit group 13 may be provided with a plurality of IPs. In that case, since the SWLS operation and the non-SWLS operation can be mixed for each IP, the address conversion circuit 135 may convert the access address for each IP.

In FIG. 1, the operation mode setting register 134 and the address conversion circuit 135 are shown as the configuration included in the second bus 132, but the present disclosure is not limited thereto. That is, the operation mode setting register 134 and the address conversion circuit 135 need only be included in the second circuit group 13, and are not necessarily included in the second bus 132. For example, the second IP 131 may include the operation mode setting register 134 and the address conversion circuit 135.

In FIG. 1, the operation mode setting register 134 and the address conversion circuit 135 are shown as the configuration included in the second bus 132 on the second circuit group 13 side, but they may be included in the first bus 122 on the first circuit group 12 side. In that case, the program for the SWLS may be written so as to correspond to the address assigned to the second memory 133 in the second address space.

In FIG. 2, although the processing of setting the addresses for the SWLS operation is described as being performed before the processing of transferring the program and data for the SWLS, the order of the processing of setting the addresses for the SWLS operation and the processing of transferring the program and data for the SWLS may be exchanged.

The CPU 11 may be configured to be accessible to the second memory 133 during the SWLS operation and the non-SWLS operation. In this case, the address conversion circuit 135 does not convert the access address from the CPU 11 to the second memory 133 regardless of the value set in the operation mode setting register 134.

Modification of First Embodiment

Next, a modification of the first embodiment will be described. In the first embodiment, although the first IP 121 and the second IP 131 are described as executing the same program for the SWLS, the first IP 121 and the second IP 131 can also execute different programs for the SWLS. In the modification of the first embodiment, a configuration and operation of the semiconductor device 1 when the different programs for the SWLS are executed will be described.

The first IP 121 executes a first program for the SWLS. The first program for the SWLS is written so as to correspond to the address assigned to the first memory 123 in the first address space. The second IP 131 executes a second program for the SWLS. The second program for the SWLS is written to correspond to an address assigned to the second memory 133 in the second address space. Although the first program for the SWLS and the second program for the SWLS are different in the descriptions about the address for accessing the first memory 123 and the address for accessing the second memory 133, the execution result of the first program for the SWLS and the execution result of the second program for the SWLS become the same.

Further, since the second IP 131 executes the second program for the SWLS written to be executed by the second IP 131, the operation mode setting register 134 and the address conversion circuit 135 are not needed. Therefore, the semiconductor device 1 according to the modification of the first embodiment does not include the operation mode setting register 134 and the address conversion circuit 135. That is, in the modification of the first embodiment, the second circuit group 13 does not convert the access address from the second IP 131 to the second memories 133 during the SWLS operation.

Figure 3:
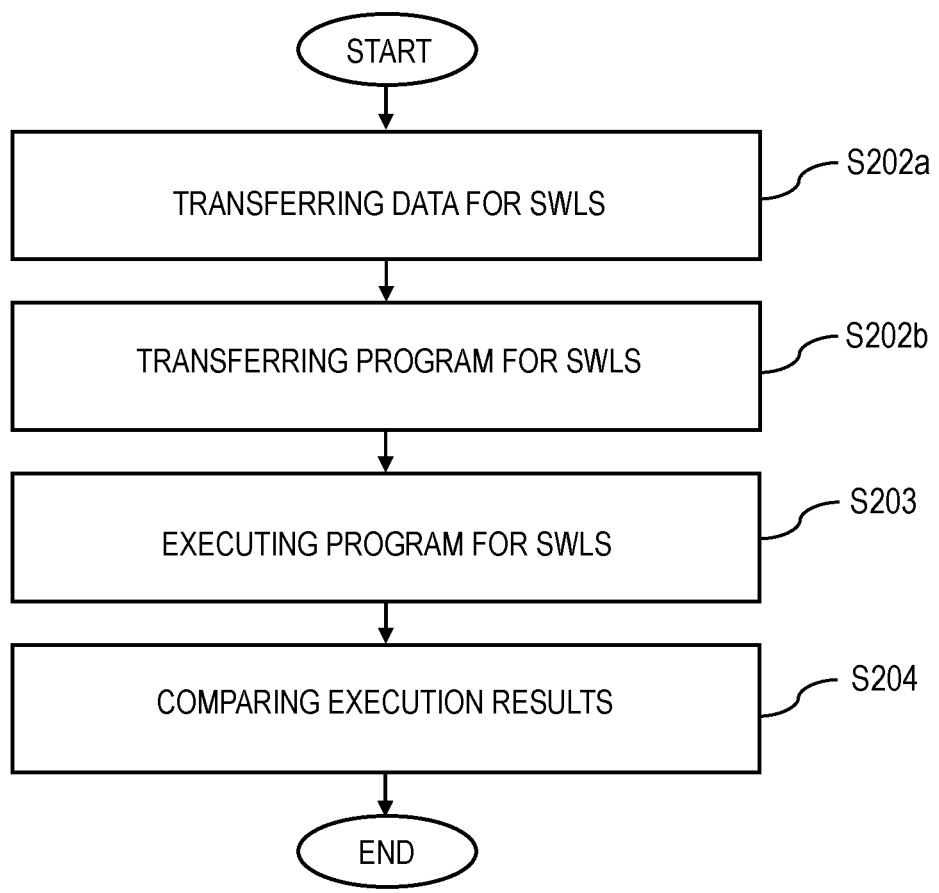
FIG. 3 is a flowchart showing an example of a SWLS operation of a semiconductor device according to a modification of the first embodiment.

FIG. 3 is a flowchart showing an example of the SWLS operation of the semiconductor device 1 according to the modification of the first embodiment. The flowchart of FIG. 3 differs from the flowchart of FIG. 2 in processing of steps S202a and S202b. In addition, in the flowcharts of FIGS. 2 and 3, the processing of the steps S203 and S204 are the same.

In the step S202a of FIG. 3, processing of transferring the data for the SWLS is performed. In the processing of transferring the data for the SWLS, the transfer control circuit 15 reads the data for the SWLS stored in the third memory 2 via the third bus 14. The transfer control circuit 15 transfers the read data for the SWLS to the first memory 123 and the second memory 133 via the first bus 122 and the second bus 132. The processing of the step S202a of FIG. 3 differs from the processing of the step S202 of FIG. 2 in that only data for the SWLS is transferred without transferring the program for the SWLS.

In the step S202b of FIG. 3, processing of transferring the program for the SWLS is performed. In the processing of transferring the program for the SWLS, the transfer control circuit 15 reads the first program for the SWLS stored in the third memory 2 via the third bus 14, and transfers the read first program for the SWLS to the first memory 123 via the first bus 122. In addition, the transfer control circuit 15 reads the second program for the SWLS stored in the third memory 2 via the third bus 14, and transfers the read second program for the SWLS to the second memory 133 via the first bus 132.

According to the modification of the first embodiment, since the transfer control circuit 15 can transfer the data for the SWLS by one transfer processing from the third memory 2 to the first memory 123 and the second memory 133, the bus bandwidth required for accessing the third memory 2 can be reduced.

In the above description, the transfer control circuit 15 performs the transfer processing of the first program for the SWLS and the second program for the SWLS in the step S202b, but the first IP 121 and the second IP 131 may perform the transfer processing. In this instance, after the CPU 11 detects that transferring the data for the SWLS by the transfer control circuit 15 has been completed, the CPU 11 activates the first IP 121 to cause the first IP 121 to start the transfer of the first program for the SWLS, and activates the second IP 131 to cause the second IP 131 to start the transfer of the second program for the SWLS.

The activated first IP 121 transfers the first program for the SWLS from the third memory 2 to the first memory 123 via the path connecting the first bus 122 and the third bus 14. Further, the activated second IP 131 transfers the second program for the SWLS from the third memory 2 to the second memory 133 via the path connecting the second bus 132 and the third bus 14.

Second Embodiment

Figure 4:
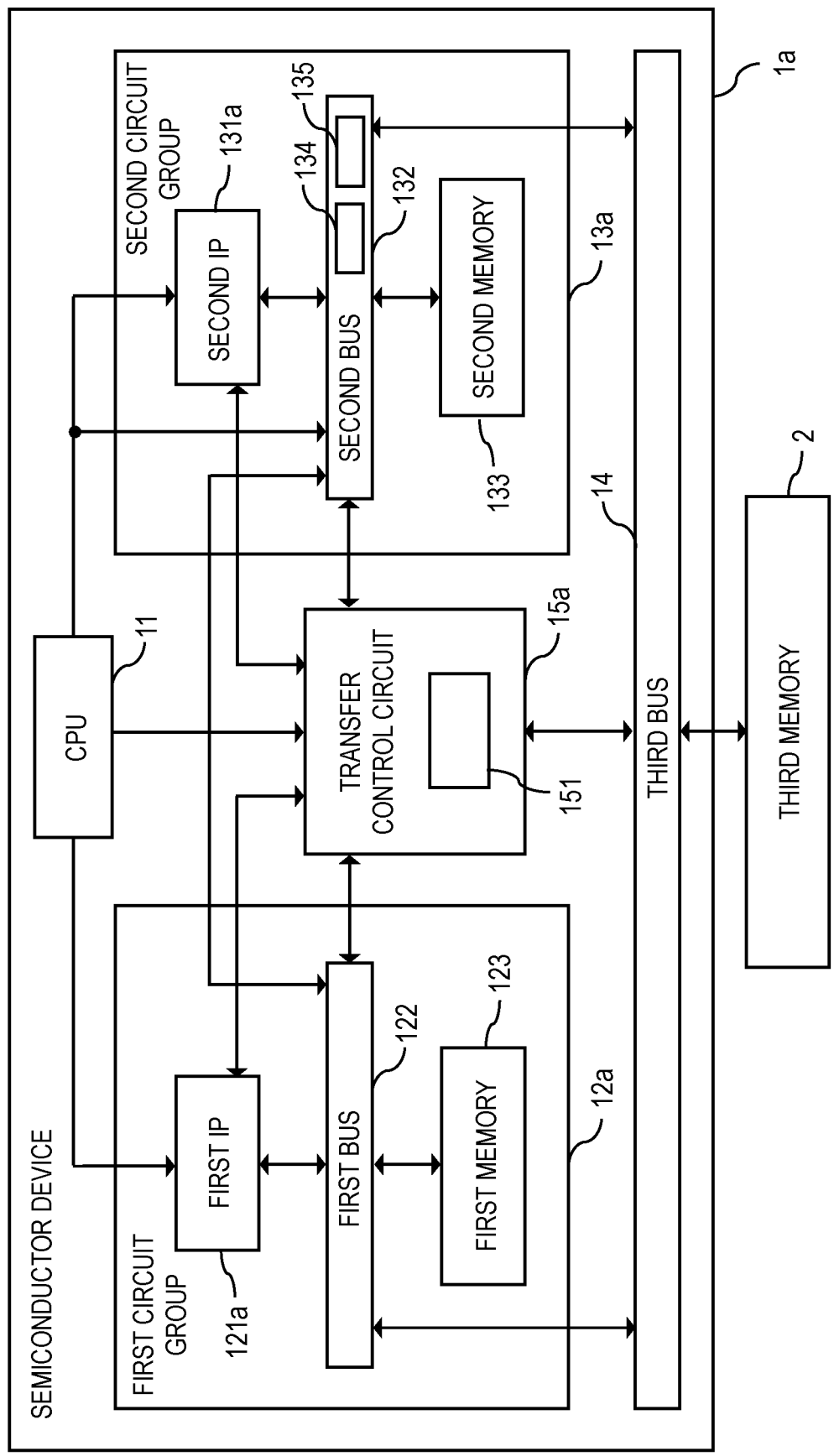
FIG. 4 is a block diagram showing an example of a configuration of a semiconductor device according to a second embodiment.

Next, a second embodiment will be described. A semiconductor device according to the second embodiment differs from the semiconductor device according to the first embodiment in that it is possible to mutually communicate between the first IP and the transfer control circuit and between the second IP and the transfer control circuit. FIG. 4 is a block diagram showing an example of a configuration of a semiconductor device 1a according to the second embodiment. As shown in FIG. 4, the first circuit group 12, the first IP 121, the second circuit group 13, the second IP 131, and the transfer control circuit 15 in FIG. 1 are changed to a first circuit group 12a, a first IP 121a, a second circuit group 13a, a second IP 131a, and a transfer control circuit 15a, respectively.

The transfer control circuit 15a is connected to the first IP 121a and the second IP 131a. After the transfer control circuit 15a has completed the transfer processing of the program and data for the SWLS, the transfer control circuit 15a transmits an activation request for causing the first IP 121a to execute the program for the SWLS to the first IP 121a, and transmits an activation request for causing the second IP 131a to execute the program for the SWLS to the second IP 131a. These activation requests are performed, for example, by transmitting a signal for notifying the completion of the transfer processing from the transfer control circuit 15a to the first IP 121a, and transmitting a signal for notifying the completion of the transfer processing from the transfer control circuit 15a to the second IP 131a. After receiving the activation request, each of the first IP 121a and the second IP 131a executes the program for the SWLS After the first IP 121a and the second IP 131a have completed the execution processing of the program for the SWLS, each of the first IP 121a and the second IP 131a transmits, to the transfer control circuit 15a, an activation request for causing the transfer control circuit 15a to read the first execution result stored in the first memory 123 and the second execution result stored in the second memory 133 and to compare them. These activation requests are performed, for example, by transmitting a signal for notifying the completion of the execution processing from the first IP 121a to the transfer control circuit 15a, and transmitting a signal for notifying the completion of the execution processing from the second IP 131a to the transfer control circuit 15a. After receiving the activation request from the first IP 121a and the activation from the second IP 131a, the transfer control circuit 15a compares the first execution result with the second execution result.

As described above, according to the second embodiment, the transfer control circuit 15a can transmit the activation request for causing the first IP 121a to execute the program for the SWLS to the first IP 121a, and transmit the activation request for causing the second IP 131a to execute the program for the SWLS to the second IP 131a, without using the CPU 11. Further, each of the first IP 121a and the second IP 131a can transmit, to the transfer control circuit 15a, the activation request for causing the transfer control circuit 15a to read the first execution result and the second execution result and to compare them, without using the CPU 11. As a result, compared with the semiconductor device 1 according to the first embodiment, the semiconductor device 1a according to the second embodiment can greatly reduce the burden of the CPU 11 for interrupt processing. In particular, as the number of IPs included in the first circuit group 12a and the second circuit group 13a increases, the effect of reducing the load on the CPU 11 becomes more remarkable.

The above-mentioned activation requests may include processing for register setting of the transfer control circuit 15a, the first IP 121a, or the second IP 131a. In addition, even when the transfer control circuit 15a, the first IP 121a, and the second IP 131a receive the activation request while performing other processing, the activation request may be queued and the queued activation request may be processed later.

Third Embodiment

Figure 5:
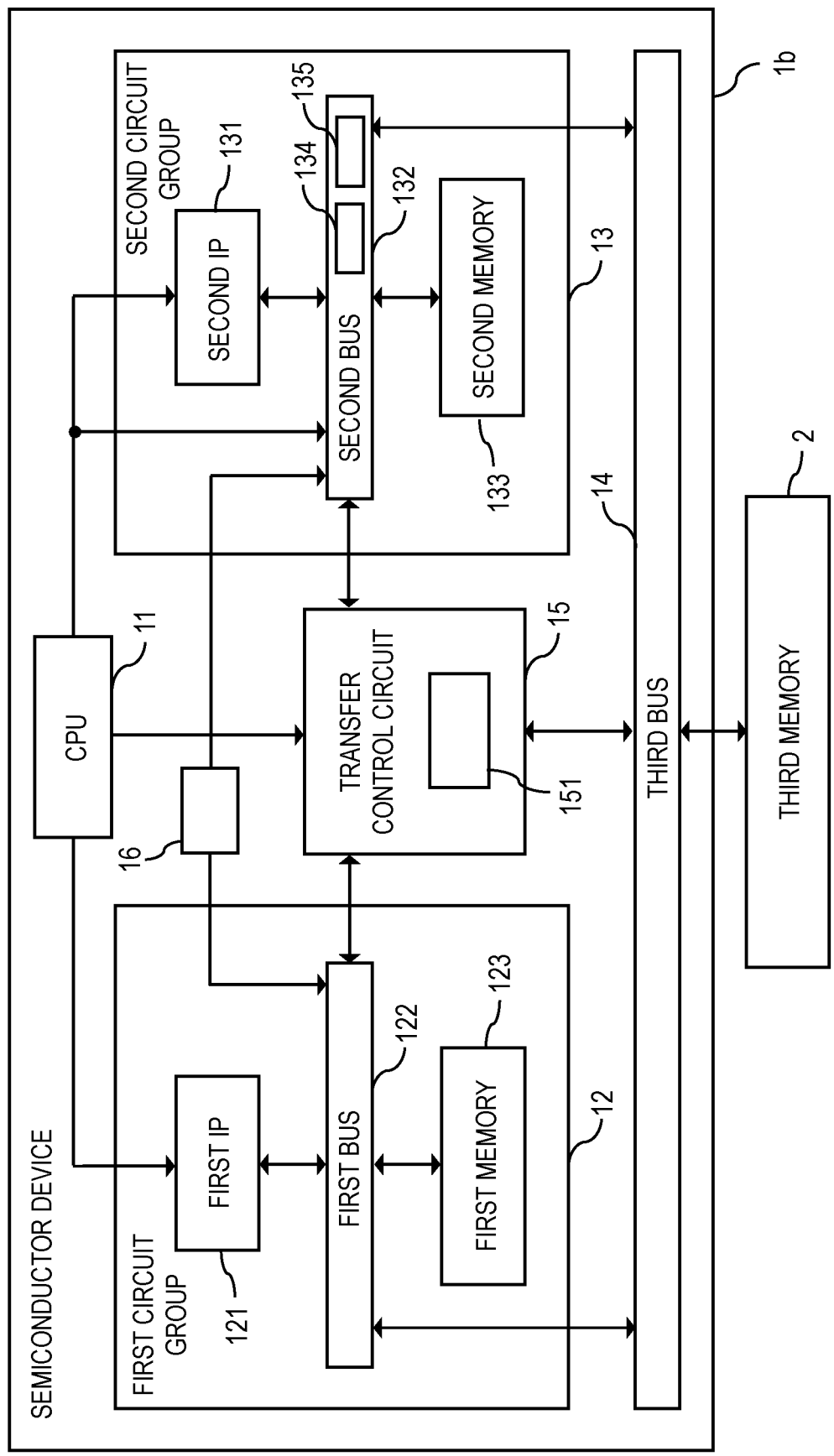
FIG. 5 is a block diagram showing an example of a configuration of a semiconductor device according to a third embodiment.

Next, a third embodiment will be described. A semiconductor device according to the third embodiment differs from the semiconductor devices according to the first and second embodiments in that the transfer control circuit includes a protection circuit. FIG. 5 is a block diagram showing an example of a configuration of a semiconductor device 1b according to the third embodiment. As shown in FIG. 5, the semiconductor device 1b includes the protection circuit 16 on the path connecting the first bus 122 and the second bus 132.

The first IP 121 accesses the second memory 133 included in the second circuit group 13 via the path connecting the first bus 122 and the second bus 132. In addition, the second IP 131 accesses the first memory 123 included in the first circuit group 12 via the path connecting the first bus 122 and the second bus 132. Therefore, the first IP 121 and the second IP 131 can increase the memory capacity that can be used.

The protection circuit 16 controls permission or non-permission of access from the first IP 121 to the second memory 133 and access from the second IP 131 to the first memory 123. Specifically, when the SWLS is being performed, the protection circuit 16 prohibits the first IP 121 from accessing the second memory 133 via the path connecting the first bus 122 and the second bus 132, and the second IP 131 from accessing the first memory 123 via the path connecting the first bus 122 and the second bus 132. On the other hand, when the SWLS is not being performed, the protection circuit 16 allows the first IP 121 to access the second memory 133 via the path connecting the first bus 122 and the second bus 132, and the second IP 131 to access the first memory 123 via the path connecting the first bus 122 and the second bus 132.

As described above, according to the third embodiment, the protection circuit 16 monitors accesses from one circuit group to another circuit group, such as accesses from the first IP 121 to the second memory 133 and accesses from the second IP 131 to the first memory 123, and prohibits such access during the SWLS operation. Thereby, for example, it is possible to avoid the problem that a failure in which the first IP 121 stores the same data in both the first memory 123 and the second memory 133 during the SWLS operation cannot be detected.

The protection circuit 16 can determine whether or not the SWLS is being performed based on the value set in the operation mode setting register 134. The protection circuit 16 may also be configured to directly receive, from the CPU 11, information as to whether or not the SWLS is being performed.

Further, in the semiconductor device 1b, the first IP 121 can access the second memory 133, and the second IP 131 can access the first memory 123, via the third bus 14 not using the path connecting the first bus 122 and the second bus 132. However, the access using the third bus 14 is not preferable because the contention for access to the third bus 14 increases.

Although the invention made by the present inventors has been specifically described based on the embodiments, it is needless to say that the present invention is not limited to the above-described embodiments, and various changes may be made without departing from the scope thereof.

What is claimed is:
1. A semiconductor device which performs a SoftWare Lock-Step (SWLS), comprising:
 a first circuit group including a first Intellectual Property (IP) to be operated in a first address space, a first bus, and a first memory coupled to the first IP via the first bus;
 a second circuit group including a second IP to be operated in a second address space different from the first address space, a second bus, and a second memory coupled to the second IP via the second bus;
 a third bus connectable to a third memory; and
 a transfer control circuit coupled to the first to third buses, and including a comparator,
 wherein addresses assigned to the first memory in the first address space are different from addresses assigned to the second memory in the second address space,
 wherein the first memory is configured to be accessed using the addresses assigned to the first memory in the first address space,
 wherein the second memory is configured to be accessed using the addresses assigned to the second memory in the second address space,
 wherein, when the SWLS is performed,
  the transfer control circuit is configured to read a program for the SWLS from the third memory and to transfer the read program for the SWLS to the first and second memories, the first IP is configured to execute the program for the SWLS stored in the first memory to store a first execution result in the first memory, the second IP is configured to execute the program for the SWLS stored in the second memory to store a second execution result in the second memory, the transfer control circuit is configured to read the first and second execution results from the first and second memories, and compare the first execution result with the second execution result using the comparator, and the second circuit group is configured to convert an access address from the second IP to the second memory such that an address assigned to the second memory in the second address space is a same as an address assigned to the first memory in the first address space, wherein an address for data access written in the program for the SWLS corresponds to an address assigned to the first memory in the first address space, wherein the second bus comprises:

an address conversion circuit configured to convert the access address from the second IP to the second memory; and an operation mode setting register configured to be set to any of a first value indicating that the SWLS is to be performed and a second value indicating that the SWLS is not to be performed, wherein, when the first value is set in the operation mode setting register, the address conversion circuit is configured to convert the access address from the second IP to the second memory such that the address assigned to the second memory in the second address space is the same as the address assigned to the first memory in the first address space, and wherein, when the second value is set in the operation mode setting register, the address conversion circuit is configured to not convert the access address from the second IP to the second memory.

2. The semiconductor device according to claim 1, further comprising a Central Processing Unit (CPU) coupled to the second bus, and wherein the address conversion circuit is configured to not convert an access address from the CPU to the second memory regardless of a value set in the operation mode setting register.

3. The semiconductor device according to claim 1, wherein, when the SWLS is performed, the transfer control circuit is configured to transfer data for the SWLS from the third memory to the first and second memories.

4. The semiconductor device according to claim 1, further comprising a Central Processing Unit (CPU) coupled to the transfer control circuit, and wherein the transfer control circuit is configured to:

store the first execution result in the third memory; and transmit an interrupt signal for notifying that the first and second execution results do not coincide with each other to the CPU when the first and second execution results do not coincide with each other.

5. The semiconductor device according to claim 1, further comprising a Central Processing Unit (CPU) coupled to the first IP, the second IP, and the transfer control circuit, and wherein the CPU is configured to activate the first and second IPs to cause the first and second IPs to execute the program for the SWLS after the CPU detects that transferring the program for the SWLS by the transfer control circuit has been completed.

6. The semiconductor device according to claim 1, further comprising a Central Processing Unit (CPU) coupled to the first IP, the second IP, and the transfer control circuit, and wherein the CPU is configured to activate the transfer control circuit to cause the transfer control circuit to compare the first execution result with the second execution result after the CPU detects that executing the program for the SWLS by the first and second IPs has been completed.

7. The semiconductor device according to claim 1, wherein the transfer control circuit is configured to transmit a first signal indicating the transferring the program for the SWLS has been completed to the first and second IPs, and wherein the first and second IPs are configured to execute the program for the SWLS after receiving the first signal.

8. The semiconductor device according to claim 1, wherein each of the first and second IPs is configured to transmit a second signal indicating the executing the program for the SWLS has been completed to the transfer control circuit, and wherein the transfer control circuit is configured to compare the first execution result with the second execution result after receiving the second signal from the first IP and the second signal from the second IP.

9. A semiconductor device which performs a SoftWare Lock-Step (SWLS), comprising:

a first circuit group including a first Intellectual Property (IP) to be operated in a first address space, a first bus, and a first memory coupled to the first IP via the first bus;

a second circuit group including a second IP to be operated in a second address space, a second bus, and a second memory coupled to the second IP via the second bus;

a third bus connectable to a third memory; and a transfer control circuit coupled to the first to third buses, and including a comparator, wherein, when the SWLS is performed, the transfer control circuit is configured to transfer a program for the SWLS from the third memory to the first and second memories, the first IP is configured to execute the program for the SWLS stored in the first memory to store a first execution result in the first memory, the second IP is configured to execute the program for the SWLS stored in the second memory to store a second execution result in the second memory, the transfer control circuit is configured to read the first and second execution results from the first and second memories, and compare the first execution result with the second execution result using the comparator, and the second circuit group is configured to convert an access address from the second IP to the second memory such that an address assigned to the second memory in the second address space is a same as an address assigned to the first memory in the first address space, wherein the semiconductor device further comprises a protection circuit on a path coupling the first bus and the second bus without passing through the transfer control circuit, and wherein the protection circuit is configured to:

prohibit the first IP from accessing the second memory via the path coupling the first bus and the second bus, and the second IP from accessing the first memory via the path coupling the first bus and the second bus, when the SWLS is being performed, and allow the first IP to access the second memory via the path coupling the first bus and the second bus, and the second IP to access the first memory via the path coupling the first bus and the second bus, when the SWLS is not being performed.

* * * * *